United States Patent
Rhee et al.

(10) Patent No.: US 9,223,223 B2
(45) Date of Patent: Dec. 29, 2015

(54) APPARATUS FOR FORMING FINE PATTERNS CAPABLE OF SWITCHING DIRECTION OF POLARIZATION INTERFERENCE PATTERN IN LASER SCANNING METHOD AND METHOD OF FORMING FINE PATTERNS USING THE SAME

(75) Inventors: Hyug-Gyo Rhee, Daejeon (KR); Yun-Woo Lee, Deajeon (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 253 days.

(21) Appl. No.: 13/878,482

(22) PCT Filed: Nov. 12, 2010

(86) PCT No.: PCT/KR2010/007982
§ 371 (c)(1),
(2), (4) Date: Apr. 9, 2013

(87) PCT Pub. No.: WO2012/057388
PCT Pub. Date: May 3, 2012

(65) Prior Publication Data
US 2013/0194558 A1 Aug. 1, 2013

(30) Foreign Application Priority Data

Oct. 27, 2010 (KR) ........................ 10-2010-0105062

(51) Int. Cl.
*G03F 7/20* (2006.01)
(52) U.S. Cl.
CPC .......... *G03F 7/70308* (2013.01); *G03F 7/2053* (2013.01); *G03F 7/70141* (2013.01); *G03F 7/70191* (2013.01)

(58) Field of Classification Search
CPC .............. G03F 7/2053; G03F 7/70141; G03F 7/70025; G03F 7/70308; G03F 7/70366; G03F 7/70408; G03F 7/7045; G03F 7/70991; G03F 7/70566; G03F 7/70191; G03F 7/70575; G03F 7/70383
See application file for complete search history.

(56) References Cited

FOREIGN PATENT DOCUMENTS

JP          06-291038          10/1994

OTHER PUBLICATIONS

Rhee et al., "Improvement of Linewidth in Laser Beam Lithographed Computer Generated Hologram", Optics Express, vol. 18, No. 2, Jan. 18, 2010, pp. 1734-1740.
Rhee et al., "Realization and Performance Evaluation of High Speed Autofocusing for Direct Laser Lithography", Review of Scientific Instruments, 80, 073103 (2009), Jul. 15, 2009.

*Primary Examiner* — Peter B Kim
*Assistant Examiner* — Michelle Iacoletti
(74) *Attorney, Agent, or Firm* — Allen, Dyer, Doppelt, Milbrath & Gilchrist, P.A.

(57) ABSTRACT

An apparatus for forming fine patterns by employing polarization interference in a laser scanning method comprises a laser generator; a calcite wave plate configured to refract at least one of the S wave and the P wave, polarized by the polarization plate, an analyzer configured to make coincident with each other the polarization directions of the S wave and the P wave having the paths spaced apart from each other by the calcite wave plate; an exposure lens; an exposure head; an X stage; and a rotation stage configured to move the substrate mounting unit around a Z axis which is a vertical axis.

9 Claims, 12 Drawing Sheets

APPARATUS FOR FORMING FINE PATTERNS CAPABLE OF SWITCHING DIRECTION OF POLARIZATION INTERFERENCE PATTERN IN LASER SCANNING METHOD AND METHOD OF FORMING FINE PATTERNS USING THE SAME

TECHNICAL FIELD

The present invention relates to an apparatus for forming fine patterns by employing polarization interference in a laser scanning method and a method of forming fine patterns using the apparatus. More particularly, the present invention relates to an apparatus for forming fine patterns using a laser exposure method which is capable of forming fine patterns having a reduced line width by employing polarization interference and a method and apparatus for forming fine patterns which are capable of switching the interference pattern direction of an interference laser beam formed by interference.

BACKGROUND ART

A method of forming fine patterns includes a photolithography method, an ion beam method, a laser exposure method, and so on. The ion beam method may be used to form a fine pattern having a finer line width because the line width of an ion beam is narrow and thus used to fabricate advanced products or high-integrated semiconductors. The laser exposure method is used to form a fine pattern by coating a photosensitive film, having varying physical properties by a laser, on a substrate, radiating a laser beam on the photosensitive film, and performing an etch process.

However, the laser exposure method may be used to quickly form fine pattern, but it has a limited fine pattern width because it has a thicker line width than the ion beam method. FIG. 1 is a cross-sectional view diagrammatically showing a conventional apparatus 10 for forming fine patterns using a laser exposure method.

As shown in FIG. 1, the conventional apparatus for forming fine patterns includes a laser generator 20, a light ballast 30, a shutter 40, an exposure head 50, beam splitters 31, a tilt mirror 90, an exposure lens 110, a substrate mounting unit 130, a substrate jig 131, an X stage 120, a Y stage 150, and a rotation stage 140. The intensity of radiation of a laser beam 1, generated by the laser generator 20 and configured to have a specific wavelength, is controlled and stabilized (that is, the intensity of radiation becomes uniform) by the light ballast 30. Next, the laser beam 1 is regulated by the shutter 40 and then incident on the exposure head 50. The path of the laser beam 1 incident on the exposure head 50 is changed by the beam splitters 31 and the tilt mirror 90 and then scanned on a photosensitive film 6, coated on a top surface of a substrate 5, via the exposure lens 110.

Furthermore, the rotation stage 140 is actuated to rotate the substrate mounting unit 130 around the Z axis, the X stage 120 is actuated to move the exposure head 50 in the X-axis direction, and the Y stage 150 is actuated to move the substrate mounting unit 130 in the Y-axis direction, thereby scanning the laser beam 1 on the photosensitive film 6. After the laser beam 1 is scanned on the photosensitive film 6, a fine pattern is formed on the substrate 5 by removing the photosensitive film on which the laser beam is not scanned by using an etchant.

FIG. 2 is a top view of a computer-producing hologram lens 7 having a fine pattern formed thereon by using the conventional apparatus for forming fine patterns using a laser exposure method. Referring to FIG. 2, a fine pattern on the inner portion of a concentric circle has a line width A of 169,607.42 nm, and a fine pattern on the outer portion of the concentric circle has a line width A of 3,271.53 nm. The line width of a fine pattern, formed by the conventional apparatus for forming fine patterns by employing a laser exposure method, has a limited line width because of the diffraction limit of an exposure lens. The diffraction limit is defined to be $1.22\lambda/NA$. Here, $\lambda$ is the wavelength of a laser beam, and NA is the numerical aperture of the exposure lens (the diameter and focal distance of the exposure lens). Accordingly, there is a need for a method of further improving the line width of a fine pattern by reducing the line width of a laser beam scanned on a photosensitive film.

DISCLOSURE OF INVENTION

Technical Problem

Accordingly, the present invention has been made in view of the above problems occurring in the prior art, and an embodiment of the present invention provides an apparatus and method for forming fine patterns, in which the paths of S and P waves are spaced apart from each other at a fine interval by using a calcite wave plate and an exposure lens transmits the S and P waves to form an interference laser beam having a predetermined interference pattern direction near a focus, thereby being capable of reducing the line width as compared with the prior art.

Furthermore, according to an embodiment of the present invention, the apparatus for forming fine patterns includes a 2-axis module unit for switching the interference pattern direction of an interference laser beam. Accordingly, there are provided the apparatus and method for forming fine patterns, which are capable of reducing the line width and also forming various forms of finer patterns. That is, a controller controls driving devices and the 2-axis module unit so that they operate in conjunction with each other in order to make an interference pattern direction coincide with a direction where the exposure lens is relatively moved. Accordingly, there are provided the apparatus and method for forming fine patterns, which are capable of reducing the line width and also forming fine patterns in various ways not only in the form of a concentric circle, but also in the X-axis direction and the Y-axis direction.

Further objects, specific merits and novel characteristics of the invention will become more apparent from the following detailed description and exemplary embodiments taken in conjunction with the accompanying drawings.

Solution to Problem

An apparatus for forming fine patterns by employing polarization interference in a laser scanning method comprises a laser generator configured to generate a laser beam; a polarization plate configured to polarize the generated laser beam into an S wave and a P wave having polarization directions orthogonal to each other; a calcite wave plate configured to refract at least one of the S wave and the P wave, polarized by the polarization plate, in a specific direction so that paths of the S wave and the P wave are spaced apart from each other at a fine interval; an analyzer configured to make coincident with each other the polarization directions of the S wave and the P wave having the paths spaced apart from each other by the calcite wave plate; an exposure lens configured to transmit the beams having the polarization directions made coincident with each other by the analyzer and scan the beams on a photosensitive film coated on a substrate; an exposure head configured to have the polarization plate, the calcite wave plate, the analyzer, and the exposure lens disposed therein; an X stage configured to move the exposure head in an X-axis direction; a substrate mounting unit configured to have the substrate mounted thereon; and a rotation stage configured to move the substrate mounting unit around a Z axis which is a vertical axis.

Advantageous Effects of Invention

As described above, according to an embodiment of the present invention, the paths of S and P waves are spaced apart from each other at a fine interval by using the calcite wave plate, and the exposure lens transmits the S and P waves to form an interference laser beam having a predetermined interference pattern direction near a focus. Accordingly, there is an effect in that the line width can be reduced as compared with the prior art. Furthermore, according to an embodiment of the present invention, the apparatus for forming fine patterns includes the 2-axis module unit for switching the interference pattern direction of an interference laser beam. Accordingly, there are advantages in that the line width can be reduced and, at the same time, various forms of finer patterns can be formed. That is, the controller according to an embodiment of the present invention controls the driving devices and the 2-axis module unit so that they operate in conjunction with each other in order to make the interference pattern direction coincident with a direction where the exposure lens is relatively moved. Accordingly, there are advantages in that the line width can be reduced and, at the same time, fine patterns can be formed in various ways not only in the form of a concentric circle, but also in the X-axis direction and the Y-axis direction, as compared with the prior art.

Although the present invention will be described in connection with preferred embodiments, those having ordinary skill in the art will readily appreciate that the present invention may be changed and modified in various ways without departing from the gist and range of the present invention. It is evident that such changes and modifications fall within the scope of the appended claims.

BRIEF DESCRIPTION OF DRAWINGS

Further objects and advantages of the invention can be more fully understood from the following detailed description taken in conjunction with the accompanying drawings in which.

DESCRIPTION OF REFERENCE NUMERALS OF PRINCIPAL ELEMENTS IN THE DRAWINGS

Figure 1:
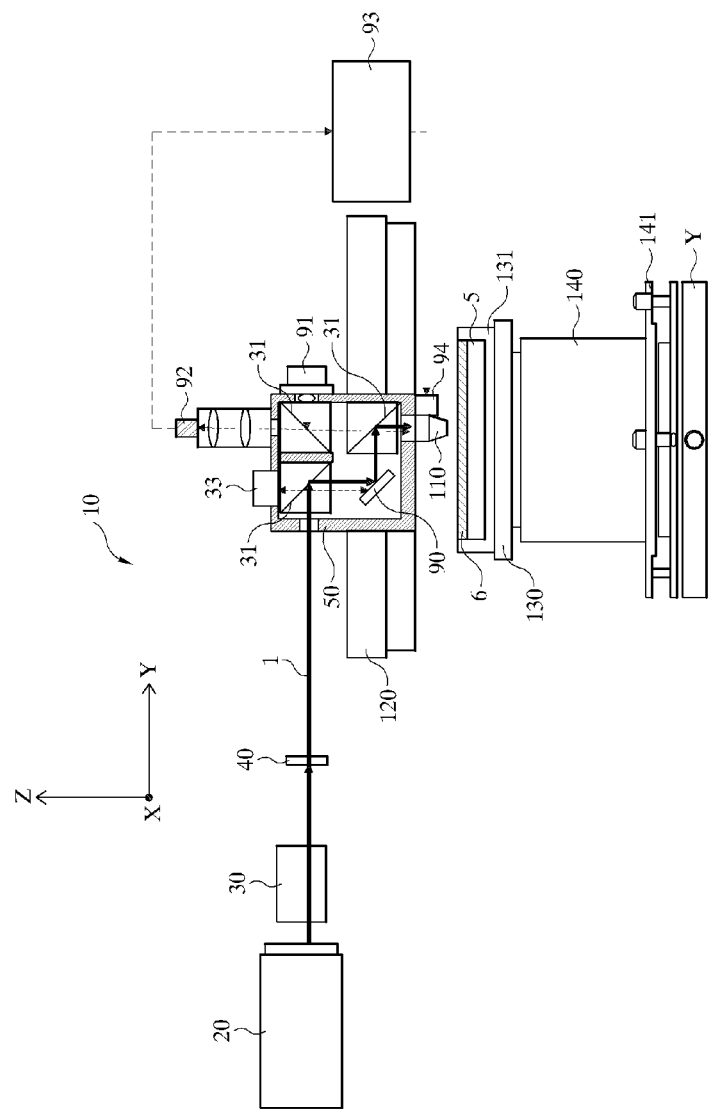
FIG. 1 is a cross-sectional view diagrammatically showing a conventional apparatus for forming fine patterns using a laser exposure method.
Figure 2:
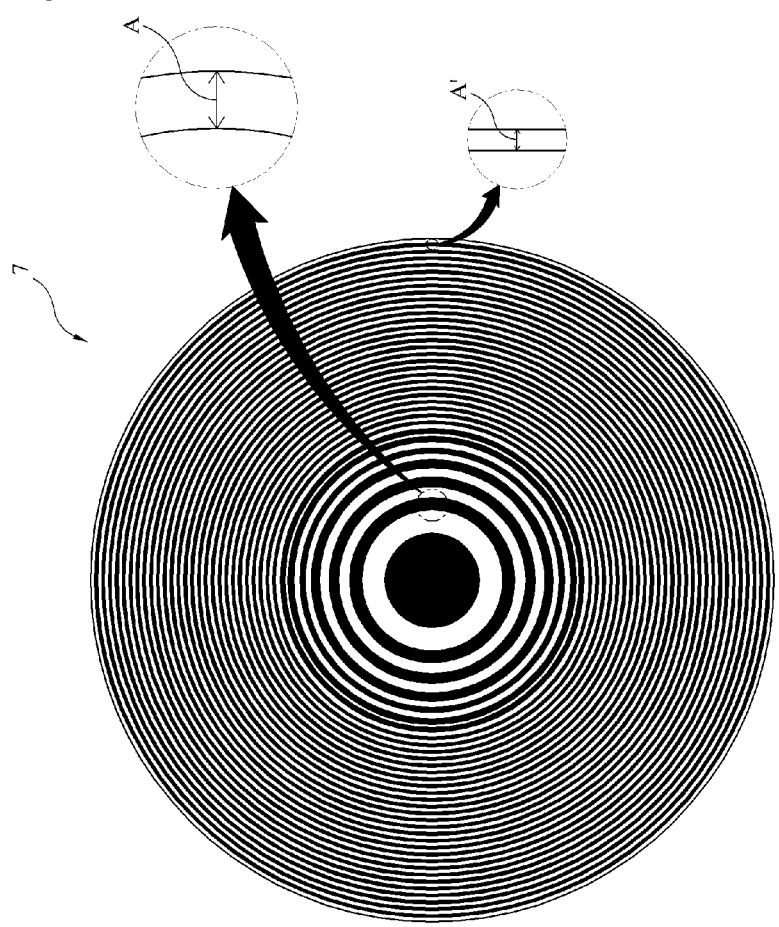
FIG. 2 is a top view of a computer-producing hologram lens having a fine pattern formed thereon by using the conventional apparatus for forming fine patterns using a laser exposure method.

1: laser beam 2: P wave
3: S wave 4: interference laser beam
5: substrate 6: photosensitive film
7: computer-producing hologram lens
10: conventional apparatus for forming fine patterns 20: laser generator 8: fine pattern
30: light ballast 31: beam splitters
32: acuosto-optic modulator 33: photodiode
34: controller 40: shutter
50: exposure head 60: polarization plate
70: calcite wave plate 80: analyzer
90: tilt mirror 91: laser diode
92: photodetector 93: focal controller
94: PZT driver 120: the X stage
100-1: apparatus for forming fine patterns according to a first embodiment
100-2: apparatus for forming fine patterns according to a second embodiment
110: exposure lens 130: substrate mounting unit
131: substrate jig 140: rotation stage
141: tilt table 200: 2-axis module unit
220: polarization beam splitters 150: the Y stage
160: controller 210: mirror
230: quarter-wavelength plate
240: angle switching mirror
250: X-axis rotation driving unit
260: Z-axis rotation driving unit
300: calcite wave plate angle switching unit
A: line width
B: direction of interference pattern
C: direction where exposure lens is relatively moved

BEST MODE FOR CARRYING OUT THE INVENTION

<Construction of Apparatus for Forming Fine Patterns and Method of Forming Fine Patterns According to First Embodiment>

Figure 3:
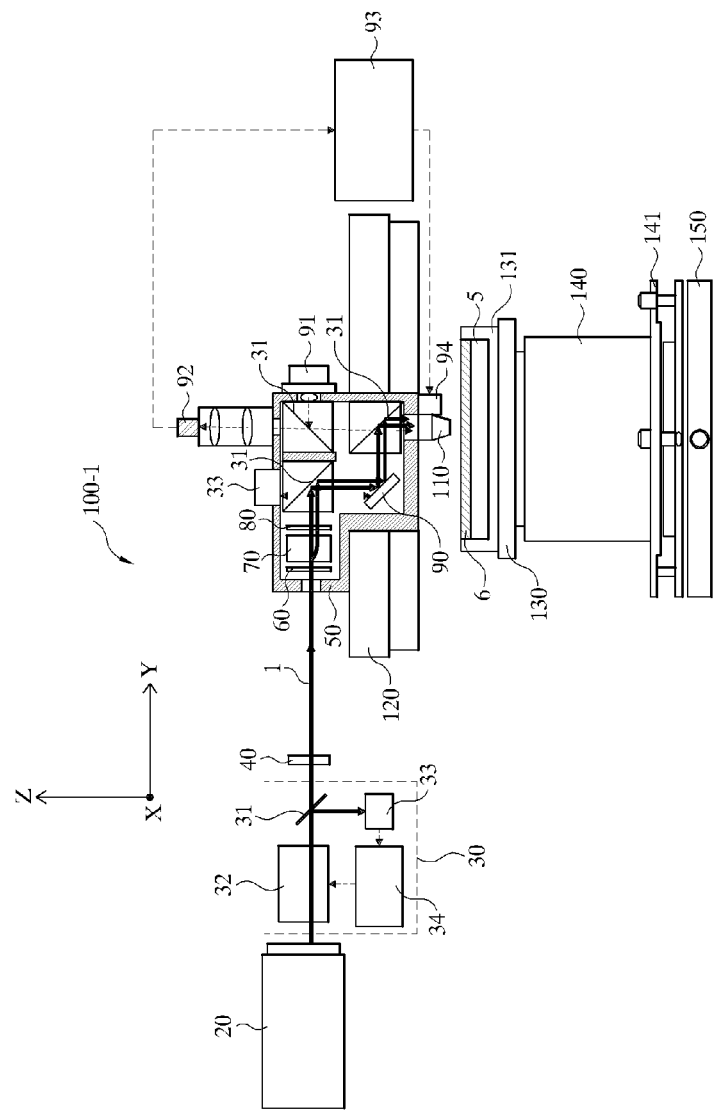
FIG. 3 is a cross-sectional view diagramatically showing an apparatus for forming fine patterns by employing polarization interference according to the first embodiment of the present invention.

Hereinafter, the construction of the apparatus for forming fine patterns according to the first embodiment of the present invention is described. The apparatus for forming fine patterns according to the first embodiment of the present invention corresponds to a manufacturing apparatus for improving the line width of a fine pattern by employing polarization interference. First, FIG. 3 is a cross-sectional view diagramatically showing the apparatus for forming fine patterns by employing polarization interference according to the first embodiment of the present invention. The apparatus 100-1 for forming fine patterns according to the first embodiment includes a laser generator 20, a light ballast 30, a shutter 40, an exposure head 50, a polarization plate 60, a calcite wave plate 70, an analyzer 80, a tilt mirror 90, a focus adjustment unit, an exposure lens 110, an X stage 120, a substrate mounting unit 130 on which a substrate 5 having a photosensitive film 6 coated thereon is mounted, a substrate jig 131, a Y stage 150, a rotation stage 140, and so on.

Figure 4:
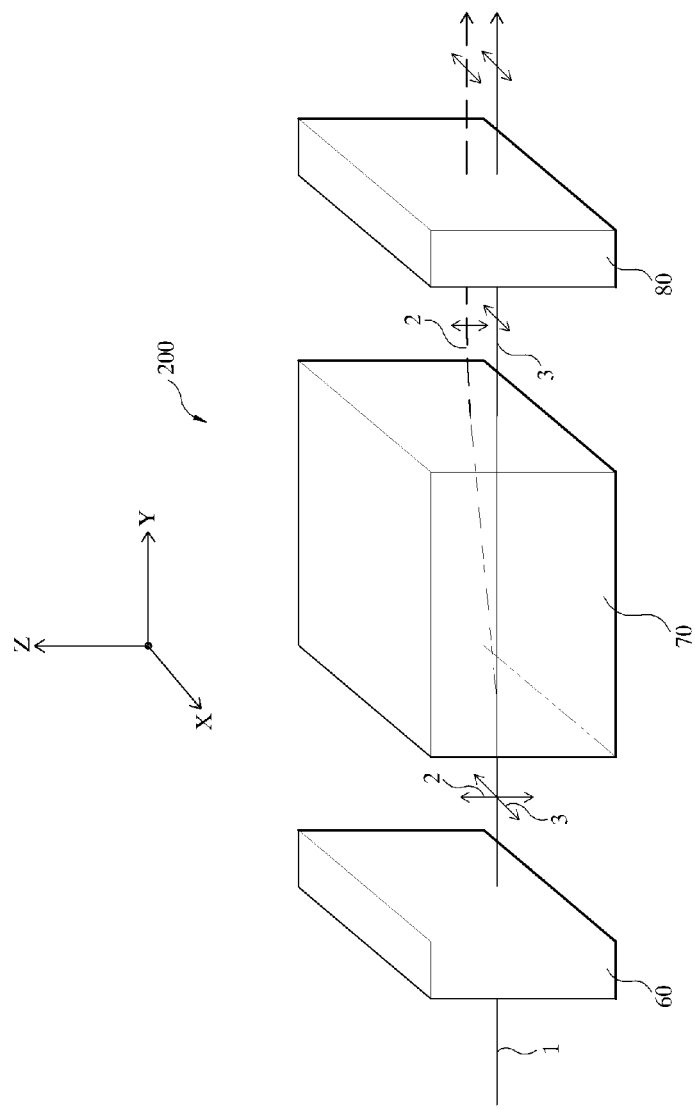
FIG. 4 is a perspective view showing the polarization plate, the calcite wave plate, and the analyzer of the apparatus for forming fine patterns according to the first embodiment of the present invention.

The paths of a P wave 2 and an S wave 3 of the laser beam 1 incident on the exposure head 50 are spaced apart from each other at a fine interval by the calcite wave plate 70. FIG. 4 is a perspective view showing the polarization plate 60, the calcite wave plate 70, and the analyzer 80 of the apparatus for forming fine patterns according to the first embodiment of the present invention. As shown in FIG. 4, the laser beam 1 incident on the exposure head 50 passes through the polarization plate 60, and it is polarized into the S wave 3 and the P wave 2 having polarization directions orthogonal to each other. Next, the polarized laser beam 1 is incident on the calcite wave plate 70.

The paths of a P wave 2 and an S wave 3 of the laser beam 1 incident on the exposure head 50 are spaced apart from each other at a fine interval by the calcite wave plate 70. FIG. 4 is a perspective view showing the polarization plate 60, the calcite wave plate 70, and the analyzer 80 of the apparatus for forming fine patterns according to the first embodiment of the present invention. As shown in FIG. 4, the laser beam 1 incident on the exposure head 50 passes through the polarization plate 60, and it is polarized into the S wave 3 and the P wave 2 having polarization directions vertical to each other. Next, the polarized laser beam 1 is incident on the calcite wave plate 70.

Furthermore, the P wave 2 is incident on the calcite wave plate 70 and refracted at a predetermined angle. The refracted direction of the P wave 2 is a Z-axis direction as shown in FIG. 4. Accordingly, the paths of the S wave 3 and the P wave 2 are spaced apart from each other at a fine interval and then outputted from the calcite wave plate 70. Next, the P wave 2 and the S wave 3 having their paths spaced apart from each other at a fine interval pass through the analyzer 80, and thus the polarization directions of the P wave 2 and the S wave 3 become coincident with each other.

The paths of the P wave 2 and the S wave 3, traveling in the same polarization direction, but spaced apart from each other at a fine interval, are changed by a tilt mirror 90 and the beam splitter 31, and the P wave 2 and the S wave 3 pass through the exposure lens 110. The paths of the P wave 2 and the S wave 3 which are reflected from the tilt mirror 90 and changed are not limited to the detailed embodiment, but may be changed according to the structure of the exposure head 50 and the position of the exposure lens 110. It is evident that such a detailed structure does not have an effect on the scope of the present invention. As shown in FIG. 3, mirrors for changing the paths may include the tilt mirror 90, and a tilt mirror angle adjustment unit for adjusting the angle of the tilt mirror 90 may be further included.

The tilt mirror angle adjustment unit, as shown in FIG. 3, may include a photodiode (PD) 33 and a beam splitter 31. The beam splitter 31 reflects the P wave 2 and the S wave 3 to the tilt mirror 90 and transmits light scanned through the photodiode 33. The light (different from the S wave and the P wave) emitted by the photodiode 33 passes through the beam splitter 31. Next, the light is reflected from the tilt mirror 90 and incident on the photodiode 33, thereby changing the angle of the tilt mirror 90.

The apparatus for forming fine patterns according to the first embodiment of the present invention may further include a focus adjustment unit. The focus adjustment unit can control a focus by changing the distance between the exposure lens 110 and the substrate 5. The focus adjustment unit according to the detailed embodiment includes a laser diode 91, beam splitters 31, a photodetector 92, a focal controller 93, and a PZT driver 94. A laser beam generated by the laser diode 91 is reflected from the beam splitter 31. Next, the laser beam passes through the beam splitter 31 on the lower side of FIG. 3 and is then incident on the exposure lens 110. The laser beam reflected from the exposure lens 110 passes through the two beam splitters 31, and it is then incident on the photodetector 92. The focal controller 93 sends a control signal to the PZT driver 94 on the basis of information about the reflected laser beam so that the PZT driver 94 moves the exposure lens 110. Accordingly, the distance between the exposure lens 110 and the substrate is changed.

Figure 5:
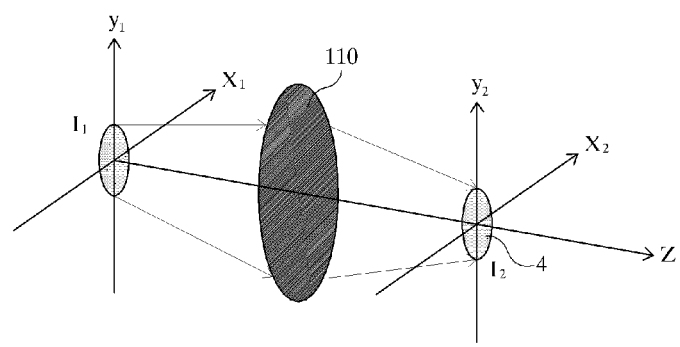
FIG. 5 is a graph in which an interference laser beam, having an interference pattern direction after an S wave and a P wave traveling with them spaced apart from each other at a fine interval are incident on an exposure lens and then interfere with each other at a focal portion of the exposure lens, is shown in $x_2$, $y_2$, and Z coordinates.

The P wave 2 and the S wave 3 passing through the exposure lens 110 interfere with each other at a focal portion, thus becoming an interference laser beam 4 having an interference pattern direction B. Next, the P wave 2 and the S wave 3 having the interference pattern direction B is scanned on the photosensitive film 6 coated on the top surface of the substrate 5. FIG. 5 is a graph in which the interference laser beam 4, having the interference pattern direction B after the S wave 3 and the P wave 2 traveled with them spaced apart from each other at a fine interval are incident on the exposure lens 100 and then interfere with each other at a focal portion of the exposure lens 110, is shown in $X_2$, $y_2$, and Z coordinates. From FIG. 5, it can be seen that the interference laser beam 4, lengthily narrowed in the $y_2$ axis and formed to have the interference pattern direction B of the $y_2$ axis direction, is formed at the focal portion of the exposure lens 110. It can also be seen that the interference pattern direction B of the $y_2$ direction is formed and thus the line width of the interference laser beam 4 in the $X_2$ axis direction is reduced.

Figure 6:
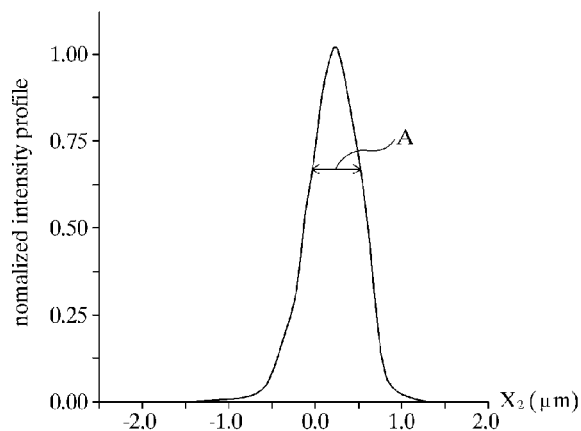
FIG. 6 is a graph showing the relationship between the intensity of a laser beam and a line width in the case in which a laser exposure method not employing interference is used in the prior art.
Figure 7:
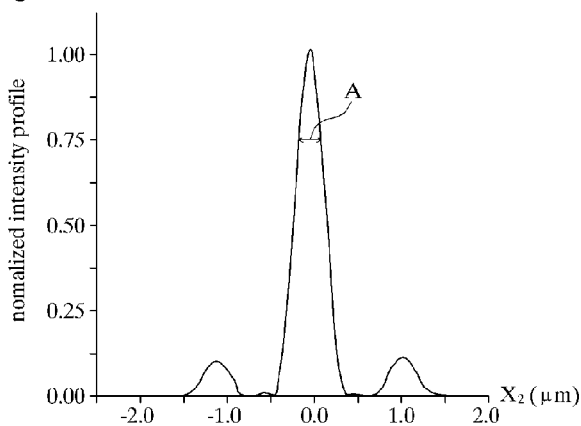
FIG. 7 is a graph showing a line width in the X-axis direction of an interference laser beam according to the first embodiment of the present invention.

FIG. 6 is a graph showing the relationship between the intensity of a laser beam and a line width A in the $X_2$ direction, in the case in which the laser exposure method not employing interference is used in the prior art. From FIG. 6, it can be seen that in the diffraction limit of the exposure lens 110, the line width A is about 0.7 μm. FIG. 7 is a graph showing a line width A in the $X_2$ axis direction of the interference laser beam 4 according to the first embodiment of the present invention. From FIG. 7, it can be seen that in the diffraction limit of the exposure lens 110, the line width A is reduced about 0.5 or less.

Figure 8:
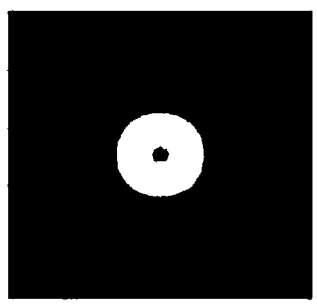
FIG. 8 is a photograph showing the cross section of a laser beam at a focal portion in the case in which an exposure method not employing interference is used in the prior art.
Figure 9:
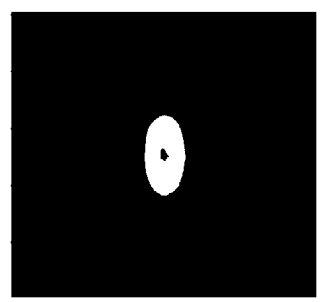
FIG. 9 is a photograph showing the cross section of the interference laser beam according to the first embodiment of the present invention.
Figure 10:
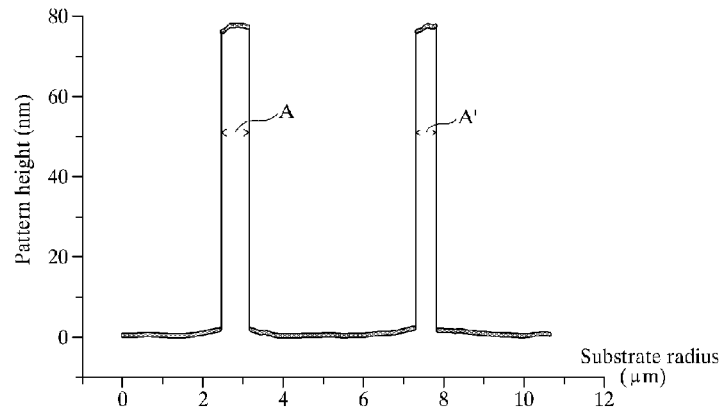
FIG. 10 is a partial cross-sectional view of a computer-producing hologram lens on which a fine pattern is formed in the case in which a laser exposure method not employing interference is used in the prior art and a fine pattern is formed by scanning the interference laser beam according to the first embodiment of the present invention.

FIG. 8 is a photograph showing the cross section of a laser beam 1 at a focal portion in the case in which a laser exposure method not employing interference is used in the prior art. FIG. 9 is a photograph showing the cross section of the interference laser beam 4 according to the first embodiment of the present invention. From FIGS. 8 and 9, it can be seen that the line width of the interference laser beam 4 in the X-axis direction is reduced and the interference pattern direction B has the $x_2$ direction. Furthermore, FIG. 10 is a partial cross-sectional view of the computer-producing hologram lens 7 on which fine patterns are formed in the case in which a laser exposure method not employing interference is used in the prior art and fine patterns are formed by scanning the interference laser beam 4 according to the first embodiment of the present invention. From FIG. 10, it can be seen that the line width A of the fine pattern is 670.2 nm in the case in which the conventional method is employed and the line width A of the fine pattern is reduced to 486.0 nm in the case in which the interference laser beam 4 is scanned according to the first embodiment.

The apparatus for forming fine patterns according to the first embodiment of the present invention may further include the X stage 120 for moving the exposure head 50 in the X-axis direction. The X stage 120 is connected to the external side of the exposure head 50 and configured to move the exposure head 50 in the X-axis direction. Furthermore, the substrate 5 is mounted on the substrate mounting unit 130 and may be fixed to the substrate mounting unit 130 by the substrate jig 131. The photosensitive film 6, made of a material whose physical properties are changed by the interference laser beam 4, is coated on the substrate 5. The photosensitive film 6 is not limited to the above material, and any material whose physical properties are changed by a laser beam may be used as the material of the photosensitive film 6.

The apparatus for forming fine patterns according to the first embodiment of the present invention may further include a Z stage for moving the substrate mounting unit 130 in the Z-axis direction (that is, a vertical axis). The apparatus may further include the Y stage 150 connected to the bottom of the rotation stage 140. The Y stage 150 can move both the rotation stage 140 and the substrate mounting unit 130 in the Y-axis direction. The apparatus for forming fine patterns according to the first embodiment of the present invention may further include a tilt table 141 disposed between the rotation stage 140 and the Y stage 150. The tilt table 141 can change an angle by tilting the rotation stage 140 and the substrate mounting unit 130.

Figure 11:
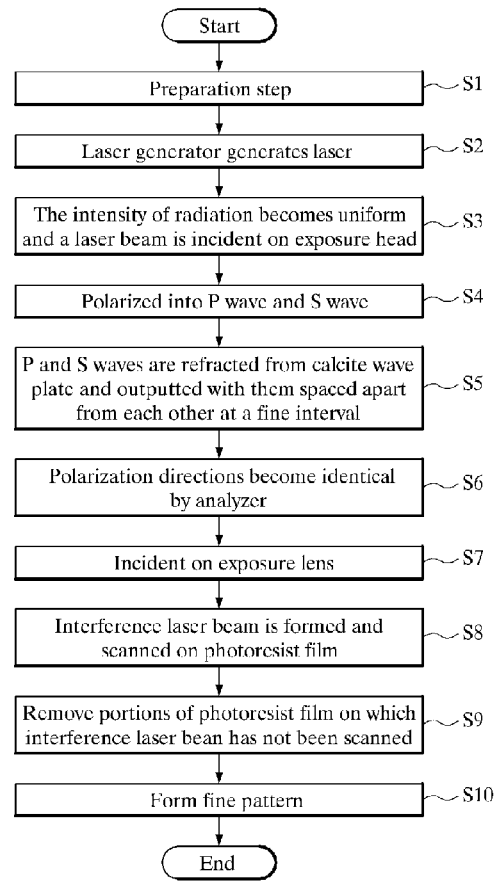
FIG. 11 is a flowchart illustrating a method of forming fine patterns by employing polarization interference according to a first embodiment of the present invention.

Hereinafter, a method of forming fine patterns by employing polarization interference according to a first embodiment of the present invention is described. FIG. 11 is a flowchart illustrating the method of forming fine patterns by employing polarization interference according to the first embodiment of the present invention. First, a preparation step of scanning the laser beam 1 is performed at step S1 in which a focus of the exposure lens 110 is adjusted by the focus adjustment unit, the X stage 120 and the Y stage 150 are actuated to make the length direction axis of the exposure lens 110 coincident with the Z axis (that is, the center axis of the rotation stage 140), an angle of the tilt mirror 90 is controlled by the tilt mirror angle adjustment unit, and the substrate 5 having the photosensitive film 6 coated thereon is mounted on the substrate mounting unit 130.

Furthermore, the laser beam 1 is generated by the laser generator 20 at step S2. The laser beam 1 generated by the laser generator 20 becomes the laser beam 1 the intensity of radiation of which has been uniformly stabilized by the light ballast 30. Next, the laser beam 1 is incident on the exposure head 50 via the shutter 40 at step S3. The laser beam 1 incident on the exposure head 50 passes through the polarization plate 60, thus being polarized into the S wave 3 and the P wave 2 having polarization directions vertical orthogonal to each other at step S4. The S wave 3 and the P wave 2 outputted from the polarization plate 60 are incident on the calcite wave plate 70. Here, the P wave 2 is refracted in a specific direction (refracted in the Z-axis direction in FIG. 4). Consequently, the paths of the P wave 2 and the S wave 3 are spaced apart from each other at a fine interval at step S5.

The P wave 2 and the S wave 3 traveling with them spaced apart from each other at a fine interval pass through the analyzer 80, thus having an identical polarization direction at step S6. The P wave 2 and the S wave 3, formed to have the identical polarization direction and spaced apart from each other at a fine interval, pass through the beam splitter 31, the tilt mirror 90, and another beam splitter 31. Next, the P wave 2 and the S wave 3 are incident on the exposure lens 110 at step S7. The P wave 2 and the S wave 3 incident on the exposure lens 110 interfere with each other at a focal portion of the exposure lens 110 and thus form the interference laser beam 4 having a specific interference pattern direction B.

Next, the interference laser beam 4 is scanned on the photosensitive film 6 coated on the top surface of the substrate 5 at step S8. When the interference laser beam 4 is scanned on the photosensitive film 6, the physical properties of scanned portions of the photosensitive film 6 are changed. The interference pattern direction B when the interference laser beam 4 is scanned on the photosensitive film 6 is identical with a direction where the S wave 3 and the P wave 2 spaced apart from each other travels. Accordingly, in the detailed embodiment, as shown in FIGS. 3 and 5a, the interference pattern direction B of the interference laser beam 4 scanned on the photosensitive film 6 is the Y-axis direction. Furthermore, the interference laser beam 4 has a form in which a line width has been reduced in the X-axis direction. The interference pattern direction B may vary according to the direction refracted by the calcite wave plate 70.

Figure 12:
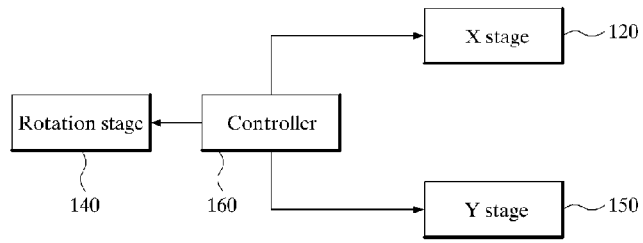
FIG. 12 is a block diagram showing the flow of signals according to a controller according to a first embodiment of the present invention.

FIG. 12 is a block diagram showing the flow of signals according to a controller 160 according to a first embodiment of the present invention. When the interference laser beam 4 is scanned, the controller 160 controls and drives the rotation speed of the rotation stage 140. Furthermore, the controller 160 drives the X stage 120 and controls the speed of the X stage 120 so that the exposure head 50 moves in the X-axis direction. In the case in which the interference pattern direction B of the scanned interference laser beam 4 is the Y-axis direction, the controller 160 drives the X stage 120. In the case in which the interference pattern direction B of the scanned interference laser beam 4 is the X-axis direction, the controller 160 drives the Y stage 150. This is for the purpose of forming a region having a reduced line width in the interference laser beam 4 as a line width of a fine pattern.

After the interference laser beam 4 is scanned on the photosensitive film 6, the generation of a laser from the laser generator 20 is finished. Portions of the photo-sensitive film 6 on which the interference laser beam 4 has not been scanned are removed by using an etchant, etc. at step S9. Consequently, the fine patterns are formed on the substrate 5 at step S10.

Mode for the Invention

Hereinafter, preferred embodiments of the present invention are described in detail with reference to the accompanying drawings in order for those skilled in the art to be able to readily practice them. In describing the operational principle relating to the preferred embodiments of the present invention, when a detailed description of well-known functions or constructions obscures the subject matter of the present invention, the detailed description will be omitted.

Furthermore, the same reference numerals designate elements having similar functions and operations throughout the drawings. Throughout the specification, when it is described that one element is coupled (or connected) to the other element, the one element may be directly coupled (or connected) to the other element or indirectly coupled (or connected) to the other element through a third element. Furthermore, when it is described that one element "includes (or comprises)" another element, it means that the one element does not exclude another element, but may include other elements, unless otherwise described.

<Construction of Apparatus for Forming Fine Patterns and Method of Forming Fine Patterns According to Second Embodiment>

Hereinafter, the construction of the apparatus for forming fine patterns according to the second embodiment of the present invention is described. The apparatus for forming fine patterns according to the second embodiment of the present invention further includes an element capable of switching the interference pattern direction B described above in connection with the first embodiment. As described above, the interference laser beam 4 has the interference pattern direction B, and only a line width in a direction vertical to the interference pattern direction B is reduced. Accordingly, a fine pattern having an improved (or reduced) line width can be fabricated only when the interference pattern direction B coincides with a direction C where the exposure lens 110 is moved relative to the substrate 5.

Figure 13:
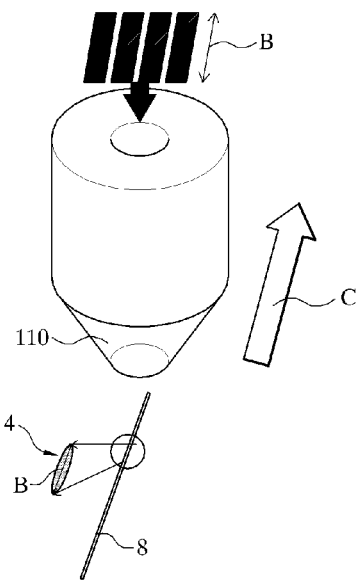
FIG. 13 shows the form of an interference laser beam scanned on the substrate in the state in which a direction where the exposure lens is relatively moved coincides with an interference pattern direction.
Figure 14:
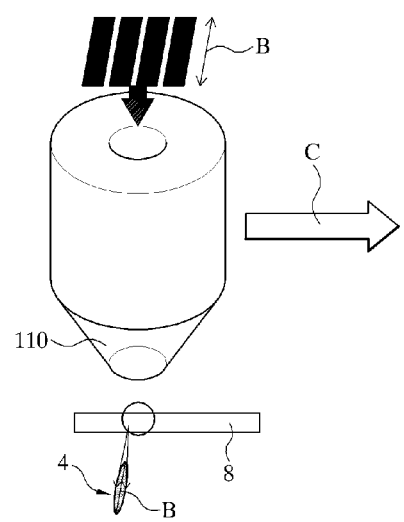
FIG. 14 shows the form of an interference laser beam scanned on the substrate in the state in which a direction where the exposure lens is relatively moved is vertical to the interference pattern direction.

FIG. 13 shows the form of an interference laser beam scanned on the substrate 5 in the state in which the direction C where the exposure lens 110 is moved relative to the substrate 5 coincides with the interference pattern direction B. FIG. 14 shows the form of an interference laser beam scanned on the substrate 5 in the state in which the direction C where the exposure lens 110 is moved relative to the substrate 5 is vertical to the interference pattern direction B. From FIGS. 13 and 14, it can be seen that in the case in which the interference pattern direction B and the relatively moving direction C of the exposure lens 110 coincide with each other, it does not help to improve a line width. Accordingly, the first embodiment can form a fine pattern of a concentric circle shape on the substrate 5, but is problematic in that it may not form fine patterns of various forms.

Figure 15:
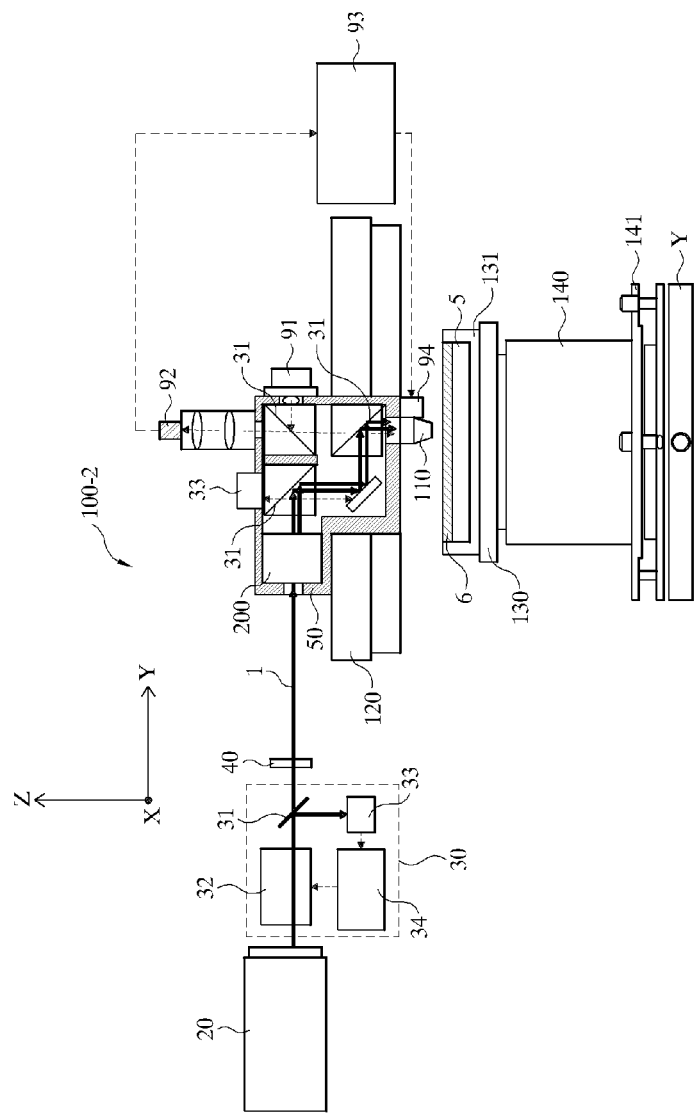
FIG. 15 is a cross-sectional view diagramatically showing an apparatus for forming fine patterns, which is capable of switching an interference pattern direction, according to a second embodiment of the present invention.

However, according to the second embodiment described hereinafter, since the interference pattern direction B can be switched, not only a fine pattern of a concentric circle shape, but also fine patterns of various forms can be formed. FIG. 15 is a cross-sectional view diagramatically showing the apparatus 100-2 for forming fine patterns, which is capable of switching the interference pattern direction B, according to the second embodiment of the present invention.

In terms of the construction, the second embodiment of the present invention differs from the first embodiment in that it further includes a 2-axis module unit 200. That is, the second embodiment of the present invention includes the 2-axis module unit 200 capable of switching the interference pattern direction B, instead of the calcite wave plate 70 of the first embodiment. A laser generator 20, a light ballast 30, a shutter 40, a polarization plate 60, an analyzer 80, an exposure head 50, a tilt mirror 90, beam splitters 31, a focus adjustment unit, an exposure lens 110, an X stage 120, a substrate mounting unit 130 on which a substrate 5 having a photosensitive film 6 coated thereon is mounted, a substrate jig 131, a Y stage 150, a rotation stage 140, and so on have the same construction as those of the first embodiment, and a detailed description thereof is omitted.

Figure 16:
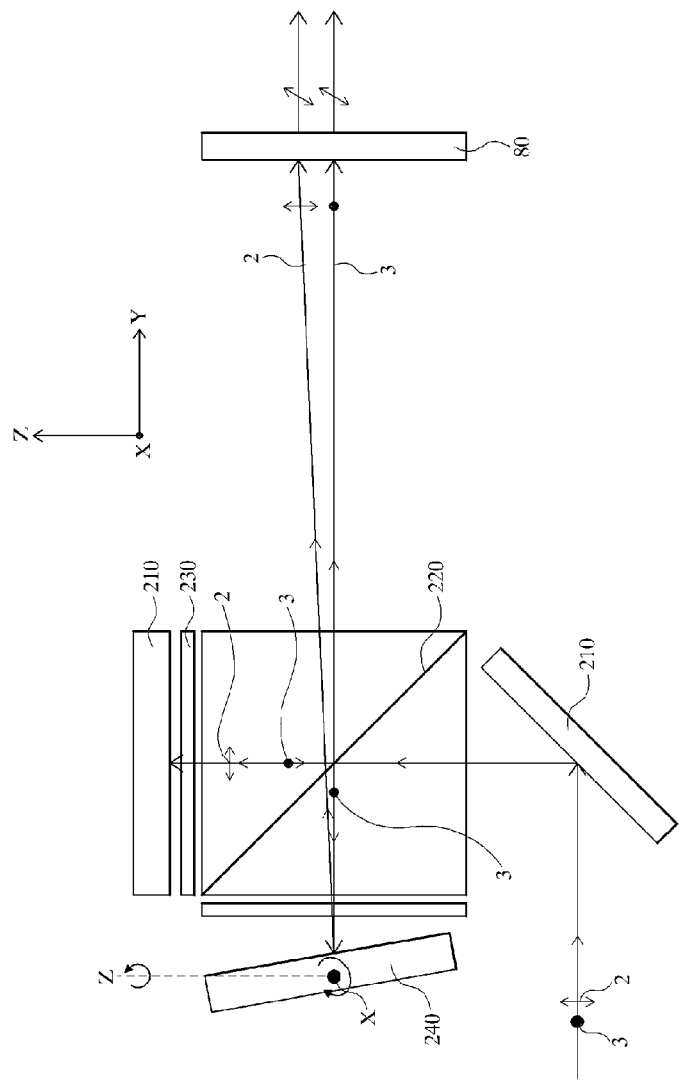
FIG. 16 is a cross-sectional view of a 2-axis module unit according to the second embodiment of the present invention.

FIG. 16 is a cross-sectional view of the 2-axis module unit 200 according to the second embodiment of the present invention. A laser beam 1 incident on the exposure head 50 passes through the polarization plate 60 (not shown in FIG. 12), and thus the laser beam 1 is polarized into an S wave 3 and a P wave 2 having polarization directions vertical orthogonal to each other. Next, the S wave 3 and the P wave 2 are reflected in the Z-axis direction by the tilt mirror 90 tilted at a predetermined angle and then incident on a polarization beam splitter 220 (refer to FIG. 12). The polarization beam splitter 220 reflects the S wave 3 therefrom and transmits the P wave 2. Accordingly, the paths of the P wave 2 and the S wave 3 are separated from each other.

In other words, the P wave 2 incident on the polarization beam splitter 220 is incident on a quarter-wavelength plate 230 disposed on the upper portion of the 2-axis module unit 200. The P wave 2 incident on the quarter-wavelength plate 230 is polarized 45 and then reflected from a mirror 210 disposed at the top of the 2-axis module unit 200. Next, the P wave 2 is incident on the quarter-wavelength plate 230 and polarized 45. The polarized P wave 2 is switched to the S wave 3 and then incident on the beam splitter 31. When the switched S wave 3 is incident on the polarization beam splitter 220, it is reflected from the polarization beam splitter 220 and outputted toward the analyzer 80. The output direction of the switched S wave 3 coincides with the Y-axis direction, as shown in FIG. 16.

Furthermore, the S wave 3 incident on the polarization beam splitter 220 is reflected therefrom. The reflected S wave 3 passes through the quarter-wavelength plate 230 on the left side of FIG. 16, thus being polarized 45° The polarized S wave 3 is reflected from an angle switching mirror 240 and then incident on the quarter-wavelength plate 230 again. The S wave 3 incident on the quarter-wavelength plate 230 is polarized 45° and switched to the P wave 2. The switched P wave 2 is incident on the beam splitter 31. When the switched P wave 2 is incident on the polarization beam splitter 220 again, it passes through the polarization beam splitter 220 and becomes the P wave 2 having a predetermined angle with the Y axis. The P wave 2 having the predetermined angle is outputted toward the analyzer 80.

Consequently, the paths of the P wave 2 and the S wave 3 outputted from the beam splitter 31 are spaced apart from each other at a fine interval and then incident on the analyzer 80. From FIG. 16, it can be seen that the direction where the P wave 2 and the S wave 3 spaced apart from each other at a fine interval travels is the Z-axis direction. The S wave 3 and the P wave 2 incident on the analyzer 80 with them spaced apart from each other at a fine interval are outputted in the same polarization direction.

The 2-axis module unit 200 according to the second embodiment further includes a mirror angle switching unit (not shown) for switching the angle of the angle switching mirror 240. The mirror angle switching unit, as shown in FIG. 16, includes an X-axis rotation driving unit 250 for rotating the angle switching mirror 240 at a predetermined angle around the X axis. In the case in which the angle switching mirror 240 is rotated around the X axis, the direction where the S wave 3 and the P wave 2, spaced apart from each other and outputted from the polarization beam splitter 220, travel becomes the Z-axis direction.

The mirror angle switching unit further includes a Z-axis rotation driving unit 260 for rotating the angle switching mirror 240 around the Z axis. If, in the state in which the angle switching mirror 240 has not been tilted around the X axis, the Z-axis rotation driving unit 260 rotates the angle switching mirror 240 at a predetermined angle around the Z axis, the direction where the S wave 3 and the P wave 2, spaced apart from each other and outputted from the beam splitter 31, travel will become the X-axis direction. Accordingly, when the angle switching mirror 240 is rotated around the X axis and around the Z axis, the interference pattern directions B of the interference laser beams 4 scanned on the photosensitive film 6 will be vertical to each other.

Figure 17:
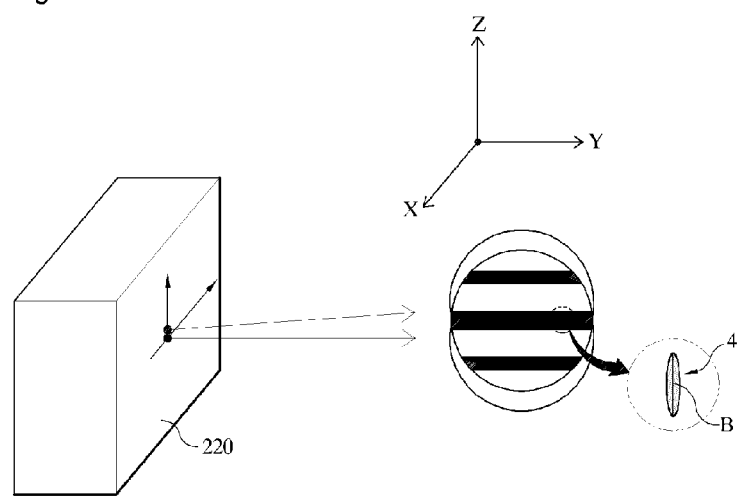
FIG. 17 shows an S wave and a P wave outputted from a beam splitters and a cross section of an interference laser beam formed when the S wave and the P wave subsequently interfere with each other, in the case in which an angle switching mirror is rotated around the X axis according to the second embodiment of the present invention.

FIG. 17 shows the S wave 3 and the P wave 2 outputted from the beam splitter 31 and a cross section of the interference laser beam B formed when the S wave 3 and the P wave 2 subsequently interfere with each other, in the case in which the angle transformation mirror 240 is rotated around the X axis according to the second embodiment of the present invention. From FIG. 17, it can be seen that the direction where the S wave 3 and the P wave 2 spaced apart from each other travel is the Z-axis direction and the interference pattern direction B of the interference laser beam 4 subsequently formed is also the Z-axis direction.

Figure 18:
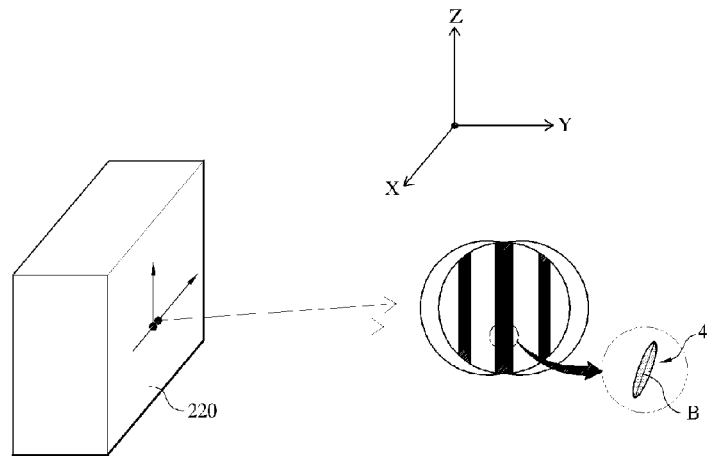
FIG. 18 shows an S wave and a P wave outputted from a beam splitters and a cross section of an interference laser beam formed when the S wave and the P wave interfere with each other, in the case in which an angle switching mirror is rotated around the Z axis according to the second embodiment of the present invention.

Furthermore, FIG. 18 shows the S wave 3 and the P wave 2 outputted from the beam splitter 31 and a cross section of the interference laser beam B formed when the S wave 3 and the P wave 2 subsequently interfere with each other, in the case in which the angle transformation mirror 240 is rotated around the Z axis according to the second embodiment of the present invention. From FIG. 18, it can be seen that the direction where the S wave 3 and the P wave 2 spaced apart from each other travel is the X-axis direction and the interference pattern direction B of the interference laser beam 4 subsequently formed is also the X-axis direction. Accordingly, according to the second embodiment of the present invention, the interference pattern direction B of the interference laser beam 4 formed can be switched.

Figure 19:
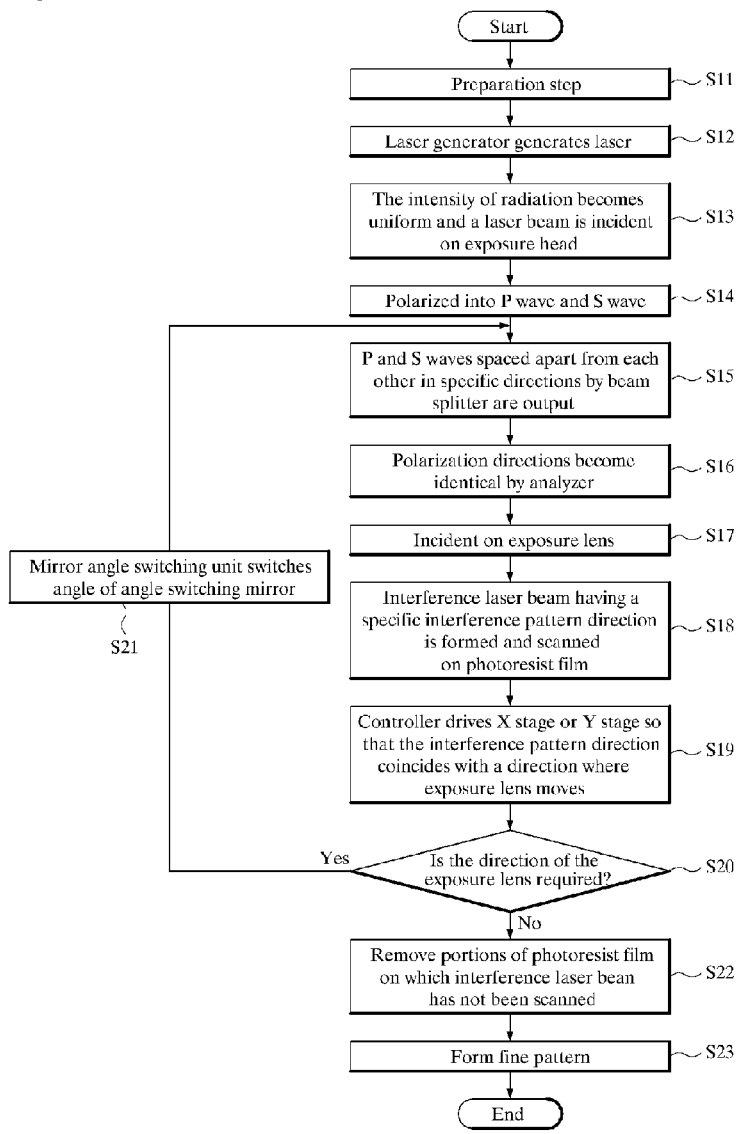
FIG. 19 is a flowchart illustrating a method of forming fine patterns, which is capable of switching an interference pattern direction, according to the second embodiment of the present invention.

Hereinafter, a method of forming fine patterns, which is capable of switching the interference pattern direction B, according to the second embodiment of the present invention is described. First, FIG. 19 is a flowchart illustrating the method of forming fine patterns, which is capable of switching the interference pattern direction B, according to the second embodiment of the present invention.

First, a preparation step of scanning the laser beam 1 is performed at step S11 in which a focus of the exposure lens 110 is adjusted by the focus adjustment unit, the X stage 120, the Y stage 150, and the rotation stage 140 are driven and set up, an angle of the tilt mirror 90 is controlled by the tilt mirror angle adjustment unit, and the substrate 5 having the photosensitive film 6 coated thereon is mounted on the substrate mounting unit 130.

Furthermore, the laser beam 1 is generated by the laser generator 20 at step S12. The laser beam 1 generated by the laser generator 20 becomes the laser beam 1 the intensity of radiation of which has been uniformly stabilized by the light ballast 30. Next, the laser beam 1 is incident on the exposure head 50 via the shutter 40 at step S13. The laser beam 1 incident on the exposure head 50 passes through the polarization plate 60, thus being polarized into the S wave 3 and the P wave 2 having polarization directions vertical orthogonal to each other at step S14.

Furthermore, as described above, the S wave 3 and the P wave 2 are outputted with them spaced apart from each other by the polarization beam splitter 220 at step S15. Next, the polarization directions of the S wave 3 and the P wave 2 are made coincident with each other by the analyzer 80 at step S16, and the S wave 3 and the P wave 2 are then incident on the exposure lens 110 at step S17. When the S wave 3 and the P wave 2 are incident on the exposure lens 110, the interference laser beam 4 having a specific interference pattern direction B is formed at a focal portion of the exposure lens 110. The formed interference laser beam 4 is scanned on the photosensitive film 6 at step S18. Next, the controller 160 drives the X stage 120 or the Y stage 150 such that the interference pattern direction B coincides with the direction C where the exposure lens 110 is moved relative to the substrate 5 at step S19. Here, the physical properties of portions of the photosensitive film 6 on which the interference laser beam 4 has been scanned are changed.

Figure 20:
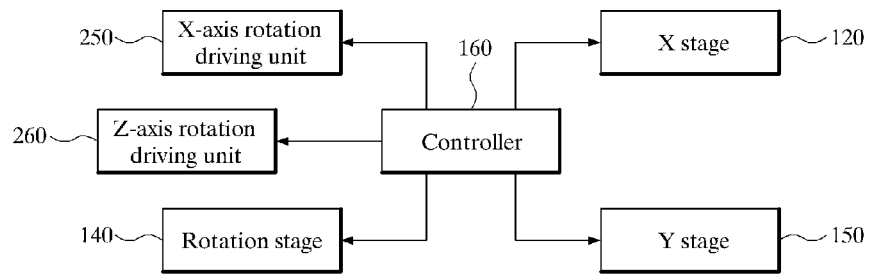
FIG. 20 is a block diagram showing the flow of signals of a controller according to the second embodiment of the present invention.

It is then determined whether the relatively moving direction C of the exposure lens 110 needs to be switched at step S20. If, as a result of the determination, the relatively moving direction C of the exposure lens 110 needs to be switched, the controller 160 drives the mirror angle switching unit so that the angle switching mirror 240 is tilted at a specific angle around the X axis or the Z axis at step S21. The process of switching the interference pattern direction B by tilting the angle switching mirror 240 is the same as that described above. FIG. 20 is a block diagram showing the flow of signals of a controller 160 according to the second embodiment of the present invention. Accordingly, the controller 160 controls the X stage 120, the Y stage 150, the X-axis rotation driving unit 250, the Z-axis rotation driving unit 260, and the rotation stage 140 such that the interference pattern direction B always coincides with the relatively moving direction C of the exposure lens 110.

After the interference laser beam 4 is scanned on the photosensitive film 6, the laser generator 20 stops generating the laser beam, and portions of the photosensitive film 6 on which the interference laser beam 4 has not been scanned are removed by using an etchant, etc. at step S22. Consequently, fine patterns are formed on the substrate 5 at step S23.

<Construction of Apparatus for Forming Fine Patterns and Method of Forming Fine Patterns According to Third Embodiment>

Hereinafter, the construction of the apparatus for forming fine patterns according to the third embodiment of the present invention is described. The apparatus for forming fine patterns according to the third embodiment of the present invention further includes an element capable of switching the interference pattern direction B as in the second embodiment. The construction of the apparatus for forming fine patterns, which is capable of switching the interference pattern direction B, according to the third embodiment of the present invention is the same as that shown in FIG. 15.

Figure 21:
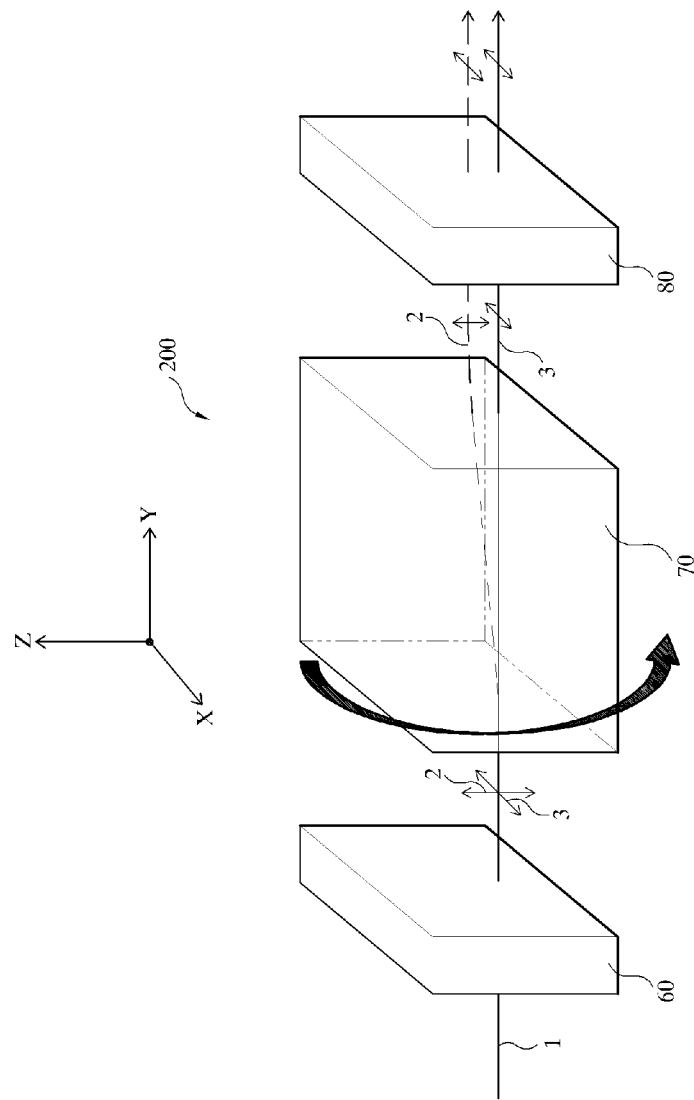
FIG. 21 is a perspective view diagramatically showing a 2-axis module unit according to a third embodiment of the present invention.

The 2-axis module unit 200 and the controller 160 according to the third embodiment of the present invention differ from the 2-axis module unit 200 in terms of the construction and the controller 160 in terms of the function according to the third embodiment. The apparatus for forming fine patterns according to the third embodiment has the same construction as that according to the second embodiment except the construction of the 2-axis module unit 200. Accordingly, the differences between the first embodiment and the second embodiment are chiefly described. FIG. 21 is a perspective view diagramatically showing the 2-axis module unit 200 according to the third embodiment of the present invention.

The laser beam 1 incident on the exposure head 50 is polarized into the S wave 3 and the P wave 2, having polarization directions vertical orthogonal to each other, by means of the polarization plate 60 and then incident on the calcite wave plate 70. The 2-axis module unit 200 according to the third embodiment of the present invention includes a calcite wave plate angle switching unit 300 (refer to FIG. 18) capable of rotating the calcite wave plate 70 per 90 degree. around the Y axis.

The P wave 2 of the S and P waves 3 and 2 incident on the calcite wave plate 70, as in the first embodiment, is refracted in the Z-axis direction (on the basis of FIG. 21). Thus, the S wave 3 and the P wave 2 have their paths spaced apart from each other in the Z-axis direction, and they are outputted from the calcite wave plate 70. Next, the analyzer 80 has the polarization directions of the S wave 3 and the P wave 2, traveling with them spaced apart from each other, coincide with each other, and then the S wave 3 and the P wave 2 are incident on the exposure lens 110.

Furthermore, in the third embodiment, in the case in which the interference pattern direction B is sought to be switched, the controller 160 controls the calcite wave plate angle switching unit 300 so that the calcite wave plate 70 is rotated 90 around the Y axis. When the calcite wave plate 70 is rotated 90 around the Y axis in FIG. 21, any one of the S wave 3 and the P wave 2 incident on the calcite wave plate 70 is refracted in the X-axis direction. Next, the S wave 3 and the P wave 2 are outputted from the calcite wave plate 70 in the state in which the S wave 3 and the P wave 2 are spaced apart from each other in the X-axis direction. Accordingly, the interference pattern direction B of the interference laser beam 4, incident on the exposure lens 110 and formed thereon, is also changed.

Figure 22:
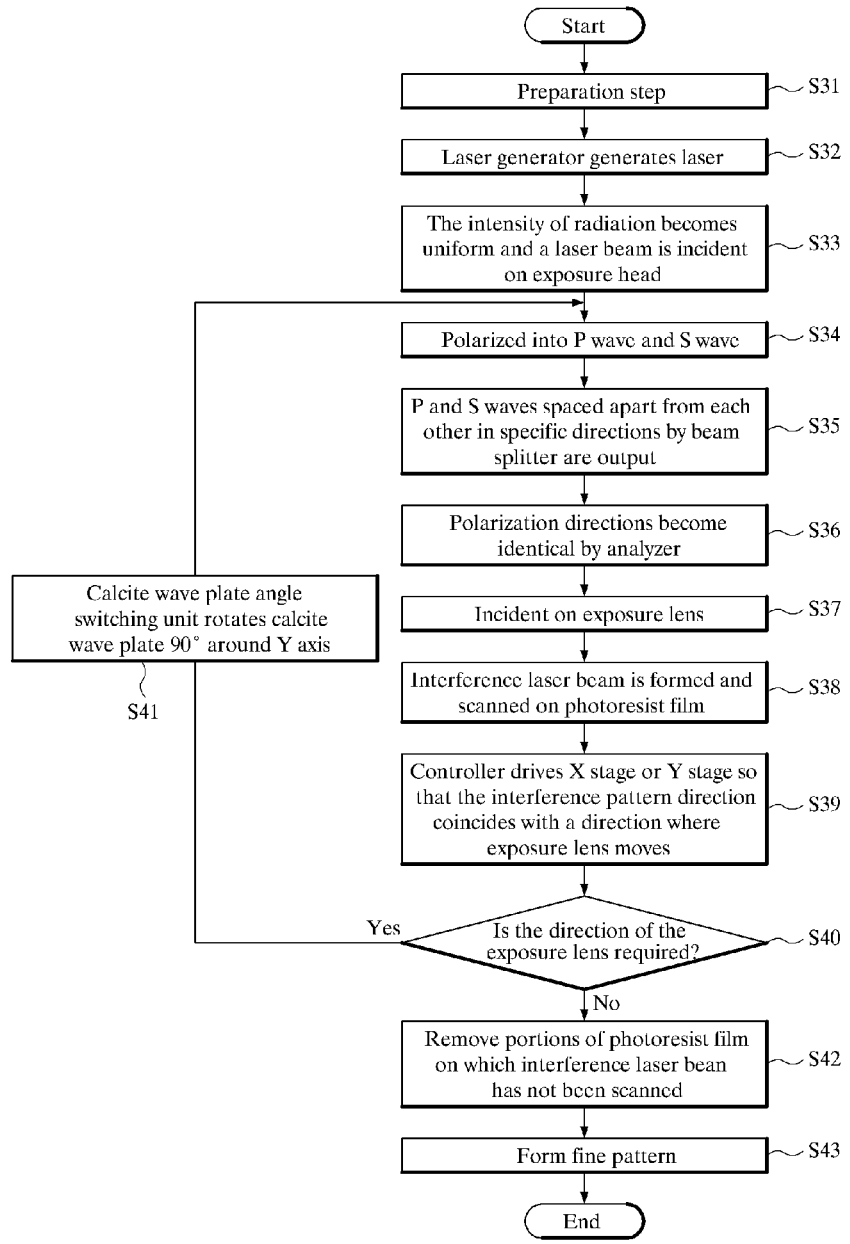
FIG. 22 is a flowchart illustrating a method of forming fine patterns which is capable of switching an interference pattern direction according to the third embodiment of the present invention.

Hereinafter, a method of forming fine patterns, which is capable of switching the interference pattern direction B, according to the third embodiment of the present invention is described. First, FIG. 22 is a flowchart illustrating the method of forming fine patterns, which is capable of switching the interference pattern direction B, according to the third embodiment of the present invention.

First, a preparation step of scanning the laser beam 1 is performed at step S31 in which a focus of the exposure lens 110 is adjusted by the focus adjustment unit, the X stage 120, the Y stage 150, and the rotation stage 140 are driven and set up as occasion demands, an angle of the tilt mirror 90 is controlled by the tilt mirror angle adjustment unit, and the substrate 5 having the photosensitive film 6 coated thereon is mounted on the substrate mounting unit 130.

Furthermore, the laser beam 1 is generated by the laser generator 20 at step S32. The laser beam 1 generated by the laser generator 20 becomes the laser beam 1 the intensity of radiation of which has been uniformly stabilized by the light ballast 30. Next, the laser beam 1 is incident on the exposure head 50 via the shutter 40 at step S33. The laser beam 1 incident on the exposure head 50 passes through the polarization plate 60, thus being polarized into the S wave 3 and the P wave 2 having polarization directions vertical orthogonal to each other at step S34. The S wave 3 and the P wave 2 outputted from the polarization plate 60 are incident on the calcite wave plate 70. The P wave 2 is refracted in a specific direction (i.e., refracted in the Z-axis direction in FIG. 16). Accordingly, the P wave 2 and the S wave 3, spaced apart from each other at a fine interval and having paths separated from each other, are outputted at step S35.

The P wave 2 and the S wave 3, traveling with them spaced apart from each other at a fine interval, pass through the analyzer 80, thus having the same polarization direction at step S36. Next, the S wave 3 and the P wave 2, formed to have the same polarization direction and spaced apart from each other at a fine interval, are reflected from the beam splitter 31, the tilt mirror 90, and another beam splitter 31 and then incident on the exposure lens 110. Next, the S wave 3 and the P wave 2 incident on the exposure lens 110 interfere with each other at a focal portion of the exposure lens 110 at step S37 and thus form the interference laser beam 4 having a specific interference pattern direction B.

Next, the formed interference laser beam 4 is scanned on the photosensitive film 6 coated on a top surface of the substrate 5 at step S38. When the interference laser beam 4 is scanned on the photosensitive film 6, the physical properties of scanned portions of the photosensitive film 6 are changed. The interference pattern direction B when the interference laser beam 4 is scanned on the photosensitive film 6 coincides with a direction where the S wave 3 and the P wave 2 travel with them spaced apart from each other.

Furthermore, the controller 160 drives the X stage 120 or the Y stage 150 so that the interference pattern direction B coincides with the direction C where the exposure lens 110 is moved relative to the substrate 5 at step S39. Here, the physical properties of portions of the photosensitive film 6 on which the interference laser beam 4 has been scanned are changed.

Figure 23:
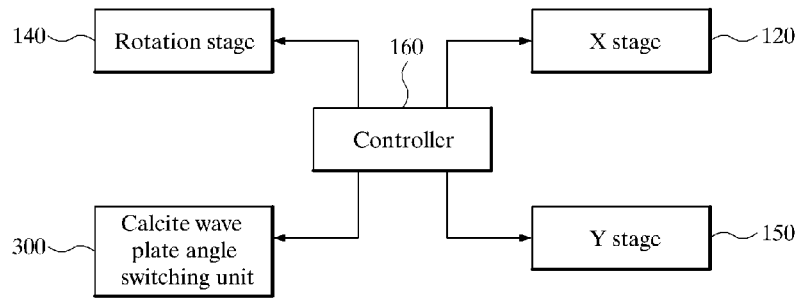
FIG. 23 is a block diagram showing the flow of signals of the controller according to the third embodiment of the present invention.

It is then determined whether the relatively moving direction C of the exposure lens 110 needs to be switched at step S40. If, as a result of the determination, the relatively moving direction C of the exposure lens 110 needs to be switched, the controller 160 controls the calcite wave plate angle switching unit 300 so that the calcite wave plate 70 is rotated 90 around the Y axis at step S41. When the calcite wave plate 70 is rotated 90, the interference pattern direction B of the interference laser beam 4 is switched as described above. FIG. 23 is a block diagram showing the flow of signals of the controller 160 according to the third embodiment of the present invention. As shown in FIG. 18, the controller 160 controls the calcite wave plate angle switching unit 300, the X stage 120, the Y stage 150, and the rotation stage 140 so that the relative traveling direction C of the exposure lens 110 is always coincident with the interference pattern direction B of the interference laser beam 4.

After the interference laser beam 4 is scanned on the photosensitive film 6, the laser generator 20 stops generating the laser beam, and portions of the photosensitive film 6 on which the interference laser beam 4 has not been scanned are removed by using an etchant, etc. at step S42. Consequently, fine patterns are formed on the substrate 5 at step S43.

Industrial Applicability

The present invention relates to an apparatus for forming fine patterns by employing polarization interference in a laser scanning method and a method of forming fine patterns using the apparatus. More particularly, the present invention relates to an apparatus for forming fine patterns using a laser exposure method which is capable of forming fine patterns having a reduced line width by employing polarization interference and a method and apparatus for forming fine patterns which are capable of switching the interference pattern direction of an interference laser beam formed by interference.

The invention claimed is:

1. An apparatus for forming patterns by employing polarization interference in a laser scanning method, the apparatus comprising:
    a laser generator configured to generate a laser beam;
    a polarization plate configured to polarize the generated laser beam into an S wave and a P wave having polarization directions orthogonal to each other;
    a calcite wave plate configured to refract at least one of the S wave and the P wave, polarized by the polarization plate, in a specific direction so that paths of the S wave and the P wave are spaced apart from each other;
    an analyzer configured to make the polarization directions of the S wave and the P wave, having the paths spaced apart from each other by the calcite wave plate, coincident with each other;
    an exposure lens configured to transmit the beams, having the polarization directions made coincident with each other by the analyzer, and scan the beams on a photosensitive film on a substrate;
    an exposure head configured to have the polarization plate, the calcite wave plate, the analyzer, and the exposure lens disposed therein;
    an X stage configured to move the exposure head in an X-axis direction;
    a substrate mounting unit configured to have the substrate mounted thereon; and
    a rotation stage configured to move the substrate mounting unit around a Z axis which is a vertical axis,
    wherein the beams passing through the exposure lens interfere with each other to form an interference laser beam scanned on the photosensitive film, and having a reduced line width in a specific direction.

2. The apparatus according to claim 1, further comprising a Y stage configured to be parallel to a horizontal plane and to move the substrate mounting unit in a Y-axis direction orthogonal to the X axis.

3. The apparatus according to claim 2, further comprising a controller configured to control a moving direction and moving speed of the X stage, the Y stage, and the rotation stage.

4. The apparatus according to claim 2, further comprising a calcite wave plate angle switching unit configured to rotate the calcite wave plate around the Y axis which is parallel to a horizontal plane and coincident with a direction of incidence of the laser beam on the polarization plate.

5. The apparatus according to claim 4, further comprising a controller for controlling the calcite wave plate angle switching unit, the X stage, and the Y stage.

6. A method of forming patterns by using an apparatus for forming the patterns by employing polarization interference in a laser scanning method, the method comprising:
    generating a laser beam to be incident on a polarization plate and then polarized into an S wave and a P wave having polarization directions orthogonal to each other;
    causing the S wave and the P wave to be incident on a calcite wave plate, and at least one of the S wave and the P wave to be refracted in a specific direction so that paths of the S wave and the P wave are spaced apart from each other;
    causing the S wave and the P wave, having the paths spaced apart from each other, to pass through an analyzer, which causes the S wave and the P wave to have an identical polarization direction;
    causing the beams having the identical polarization direction to pass through an exposure lens to form an interference laser beam;
    scanning the interference laser beam on a photosensitive film on a substrate so that physical properties of portions of the photosensitive film on which the interference laser beam has been scanned are changed; and
    selectively removing portions of the photosensitive film after scanning.

7. The method according to claim 6, wherein scanning comprises operating a controller for driving a rotation stage so that the rotation stage rotates a substrate mounting unit having the substrate mounted thereon, driving an X stage and controlling a moving speed of the X stage, and moving the exposure lens in an X-axis direction.

8. The method according to claim 7, wherein a direction of arrangement of interference fringes is coincident with a direction in which the exposure lens is relatively moved.

9. The method according to claim 7, further comprising:
    selectively operating a calcite wave plate angle switching unit for rotating the calcite wave plate around a Y axis which is parallel to a horizontal plane; and
    operating the controller for controlling the X-axis rotation driving unit, the Z-axis rotation driving unit, the X stage, and the Y stage.

* * * * *